United States Patent [19]
Goto

[11] Patent Number: 4,590,666
[45] Date of Patent: May 27, 1986

[54] METHOD FOR PRODUCING A BIPOLAR TRANSISTOR HAVING A REDUCED BASE REGION

[75] Inventor: Hiroshi Goto, Yokohama, Japan

[73] Assignee: Fujitsu Limited, Kawasaki, Japan

[21] Appl. No.: 696,884

[22] Filed: Jan. 31, 1985

Related U.S. Application Data

[62] Division of Ser. No. 425,647, Sep. 28, 1982, abandoned.

[30] Foreign Application Priority Data

Sep. 28, 1981 [JP] Japan .................... 56-151987

[51] Int. Cl.⁴ .................... H01L 21/265; H01L 21/22
[52] U.S. Cl. .................... 29/578; 29/571; 29/576 B; 148/1.5; 148/187; 148/DIG. 10; 148/DIG. 140
[58] Field of Search .................... 29/578, 571, 576 B; 148/1.5, 187

[56] References Cited

U.S. PATENT DOCUMENTS

| | | |
|---|---|---|
| 3,686,080 | 8/1972 | Banfield et al. |
| 4,054,484 | 10/1977 | Lesh et al. .................... 357/71 |
| 4,157,269 | 6/1979 | Ning et al. .................... 148/1.5 |
| 4,309,812 | 1/1982 | Horng et al. .................... 357/34 |
| 4,318,751 | 3/1982 | Horng .................... 148/1.5 |
| 4,319,932 | 3/1982 | Jambotkar .................... 357/34 |
| 4,322,883 | 4/1982 | Abbas et al. .................... 29/578 |
| 4,381,953 | 5/1983 | Ho et al. .................... 148/1.5 |
| 4,430,793 | 2/1984 | Hart .................... 357/34 |
| 4,460,417 | 7/1984 | Murase et al. .................... 148/187 |
| 4,481,706 | 11/1984 | Roche .................... 148/1.5 |

FOREIGN PATENT DOCUMENTS

| | | |
|---|---|---|
| 1934820 | 1/1971 | Fed. Rep. of Germany ........ 357/34 |
| 42-8651 | 4/1967 | Japan . |
| 42-12968 | 7/1967 | Japan . |
| 50-32022 | 10/1975 | Japan .................... 357/34 |

OTHER PUBLICATIONS

Cohen et al., Appl. Phys. Letts. 41 (Nov. 1982) 976.
Chang et al., IBM-TDB, 23 (Dec. 1980) 3240.
Jambotkar, IBM-TDB, 24 (Mar. 1982) 5123.
Chu et al., IBM-TDB, 20 (1978) 5168.
IBM Technical Disclosure Bulletin, "High Voltage Power Transistor Method", by Anantha et al., vol. 23, No. 5, Oct. 1980, pp. 1917-1918.
IBM Technical Disclosure Bulletin, "Bipolar Transistor Structure with Extended Metal Base Contacts and Diffused or Implanted Emitter", by Ning et al., vol. 22, No. 5, Oct. 1979, pp. 2123-2126.

*Primary Examiner*—Upendra Roy
*Attorney, Agent, or Firm*—Staas & Halsey

[57] ABSTRACT

A method of producing a bipolar transistor which includes forming a base region, forming a high-melting-point metal layer of a base electrode on the base region, forming a first insulating layer on the metal layer, and selectively etching the first insulating layer and the metal layer to form an opening. The method further includes forming a second insulating layer on the sides of the first insulating layer and the metal layer within the opening, the second insulating layer defining an emitter-providing region. Impurities are introduced into the base region by using the second insulating layer as a mask to form an emitter region. An emitter electrode and the base electrode are arranged in a similar multilayer structure.

5 Claims, 15 Drawing Figures

METHOD FOR PRODUCING A BIPOLAR TRANSISTOR HAVING A REDUCED BASE REGION

This is a divisional application of U.S. Ser. No. 425,647, filed on Sept. 28, 1982, now abandoned.

BACKGROUND OF THE INVENTION

1. Field of the Invention

The present invention relates to a method for producing semiconductor devices. More particularly, it relates to a method for producing bipolar transistors in an integrated circuit.

2. Description of the Prior Art

Recently, there have been attempts to make an integrated circuit (IC) comprising bipolar transistors, i.e., a bipolar IC, denser. When a base region and an emitter region of each of the bipolar transistors are decreased to increase the density, the accuracy of alignment of the emitter region in relation to the base region may become a problem. In a case where openings for a base electrode, an emitter electrode, and a collector electrode are simultaneously formed in an insulating layer, if the position of the openings for the electrodes is shifted from a predetermined position, a short-circuit between the emitter and collector or a decrease of the breakdown voltage between the emitter and collector, may occur.

A conventional method of producing a bipolar transistor is explained and the above-mentioned disadvantages are explained with reference to FIGS. 1 through 6.

On a P-type single crystalline silicon (Si) substrate (i.e., a P-type silicon wafer) 1 an N-type silicon epitaxial layer 2 is grown, as illustrated in FIG. 1. An N+-type buried layer 3 (FIG. 1) for reducing the resistance of the collector is formed by a well-known process. An antioxidizing masking layer 4, e.g., a silicon nitride ($Si_3N_4$) layer, having a thickness of, e.g., 100 nm is formed on the epitaxial layer 2 and is selectively removed by a photoetching process to leave portions corresponding to an isolation-providing region, a collector-providing region, and a base-providing region.

The epitaxial layer 2 is selectively thermally oxidized by using the silicon nitride layer 4 as a mask so that a relatively thick silicon dioxide ($SiO_2$) layer (i.e., a so-called field oxide layer or field insulating layer) 5 is formed, as illustrated in FIG. 2. P-type impurities (e.g., boron) are introduced into a portion of the epitaxial layer 2 by an ion-implantation process by using the field oxide layer 5 and a patterned photoresist layer (not shown) as a mask to form a P-type isolation region 6. N-type impurities (donor e.g., phosphorus (P)) are introduced into another portion of the epitaxial layer 2 by an ion-implantation process by using the field oxide layer 5 and another patterned photoresist layer (not shown) as another mask to form an N-type collector contact region 7. Then the semiconductor body is annealed so as to activate the isolation region 6 and the collector contact region 7.

The silicon nitride layer 4 is removed by etching to expose portions of the epitaxial layer 2. The exposed portions are thermally oxidized to form a relatively thin silicon dioxide layer 8 having a thickness of, e.g., 100 nm, as illustrated in FIG. 3. A photoresist layer 9 is coated, exposed, and developed to form an opening 10 above a base-providing region. P-type impurities (acceptor e.g., boron (B)) are introduced into the epitaxial layer 2 through the opening 10 and the silicon dioxide layer 8 by an ion-implantation process to form a base region 11.

After removal of the photoresist layer 9, a silicon oxide layer 12 is formed on the thick field oxide layer 5 and on the thin silicon dioxide layer 8 by a chemical vapor deposition (CVD) process, as illustrated in FIG. 4. The oxide layers 12 and 8 are selectively etched by a conventional photoetching process to form a collector electrode opening 13, an emitter electrode opening 14 and a base electrode opening 15, simultaneously.

A polycrystalline silicon layer 16 (FIG. 5) having a thickness of, e.g., 100 nm is formed on the silicon oxide layer 12 and exposed portions of the epitaxial layer 2 within the openings 13, 14, and 15, by a CVD process. After a patterned photoresist layer (not shown) having two openings corresponding to the openings 13 and 14 is formed, N-type impurities (e.g., arsenic (As)) are introduced into the collector contact region 7 and the base region 11 through the polycrystalline silicon layer 16 by an ion-implantaton process using the photoresist layer as a mask so that an N+-type collec contact region 17 and an N+-type emitter region 18 are formed, as illustrated in FIG. 5. An annealing treatment is carried out and then a conductive layer, such as an aluminum (Al) layer, is formed on the exposed surface of the polycrystalline silicon layer 16 by vacuum evaporation. The aluminum layer is selectively etched by a conventional photoetching process to form a collector electrode 19, an emitter electrode 20, a base electrode 21, and conductive lines (not shown). The portion of the polycrystalline silicon layer 16 which is not covered with the electrodes 19, 20, and 21 and the conductive lines, is etched with a suitable etchant. Thus, the bipolar transistor shown in FIG. 5 is produced.

When the silicon oxide layers 12 and 8 are selectively etched to form the openings 13, 14, and 15 for the collector electrode 19, the emitter electrode 20, and the base electrode 21, respectively, in the above-mentioned production process, there is the possibility of shifting the position of the openings 13, 14, and 15 from the predetermined position. In this case, if the emitter electrode opening 14 is shifted to etch a portion of the thick field oxide layer 5, as illustrated in FIG. 6, the emitter region 18 is formed at the end portion of the base region 11, whereby a short-circuit 22 between the collector and emitter is formed. In a case where the degree of shift of the position of the openings is less than that of the degree of shift shown in FIG. 6, and if the end of the emitter region is very close to the end of the base region, the breakdown voltage between the emitter and collector is decreased. In order to prevent the above-mentioned disadvantages from occurring, it is possible to make the base region large. However, an enlarged base region hinders an increase of the density of the bipolar IC.

SUMMARY OF THE INVENTION

An object of the present invention is to provide a bipolar transistor which can increase the density of a bipolar IC.

Another object of the present invention is to provide a method for producing a bipolar transistor which does not have the above-mentioned disadvantages.

According to the present invention, a bipolar transistor comprises a base electrode which is made of a high-melting-point metal and is placed on a portion of a base region. An insulating layer is formed on at least the sides of the base electrode and defines an emitter-providing region. An emitter region is formed by introducing impurities into the base region by using the insulating layer as a mask.

According to the present invention, the method of producing the above-mentioned bipolar transistor comprises the steps of depositing a high-melting-point metal on a base region to form a base electrode, forming a first insulating layer on the base electrode, selectively etching the first insulating layer and the base electrode to form an opening in which a portion of the base region is exposed, forming a second insulating layer on the sides of the base electrode and the first insulating layer, introducing impurities into the base region by using the second insulating layer as a mask to form an emitter region, and forming an emitter electrode and a collector electrode.

The above-mentioned and other objects and advantages of the present invention will become more apparent from the detailed description of preferred embodiments, set forth below, with reference to the accompanying drawings, wherein:

DESCRIPTION OF THE PREFERRED EMBODIMENTS

Figure 7:
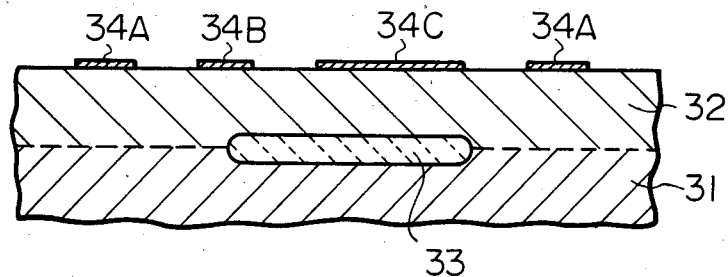
FIGS. 7 through 11 are schematic sectional views of a bipolar transistor in various stages of production in accordance with the present invention.

In FIG. 7, the starting material is a semiconductor substrate 31 of, for example, P-type single crystalline silicon. An N-type silicon epitaxial layer 32 is grown on the silicon substrate 31. An N+-type buried layer 33 is formed by a conventional process. A silicon nitride layer is formed on the epitaxial layer 32 and is selectively etched by a conventional photoetching process to leave portions 34A, 34B, and 34C, corresponding to an isolation-providing region, a collector-providing region, and a base-providing region, respectively.

Figure 1:
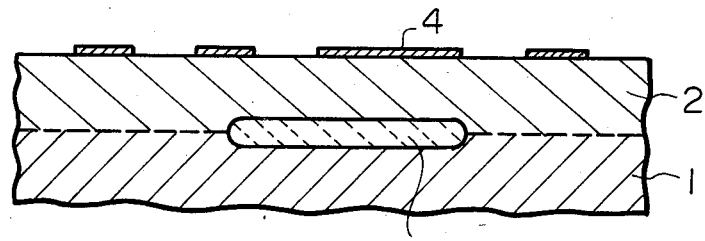
FIGS. 1 through 5 are schematic sectional views of a prior art bipolar in transistor in various stages of production.
Figure 2:
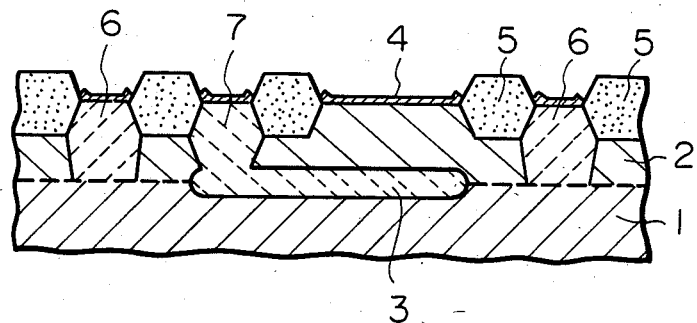
Figure 3:
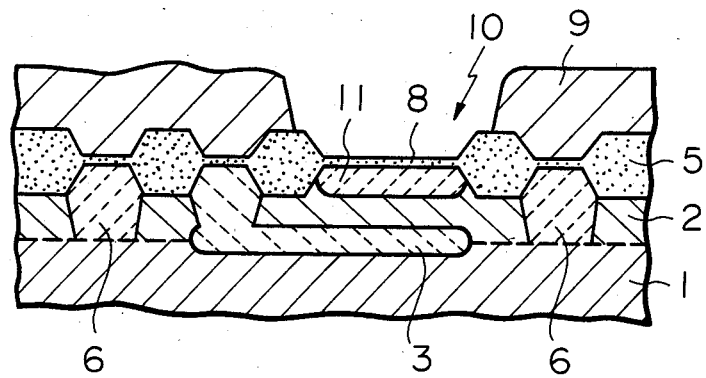
Figure 4:
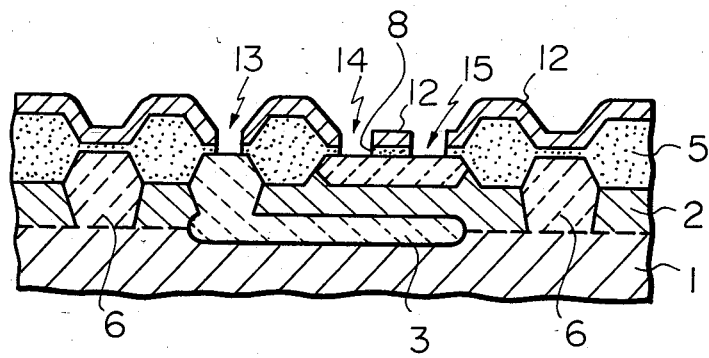
Figure 5:
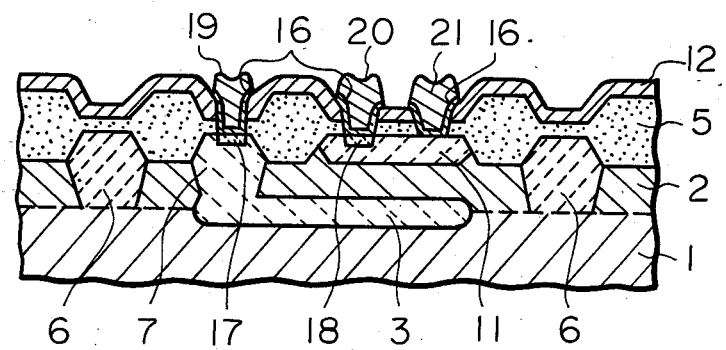
Figure 6:
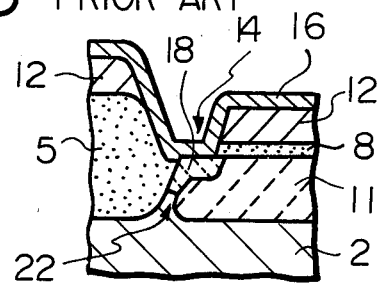
FIG. 6 is a partially enlarged sectional view of a prior art bipolar transistor.
Figure 8:
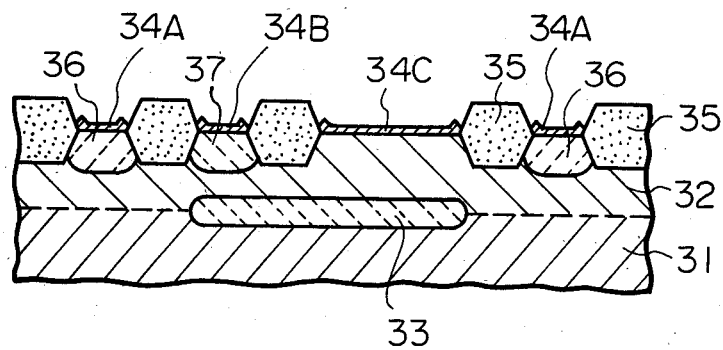

The epitaxial layer 32 is selectively thermally oxidized to form a thick silicon dioxide layer (i.e., a field oxide layer) 35, as illustrated in FIG. 8. P-type impurities (e.g., boron (B)) are selectively introduced into the epitaxial layer 32 through the silicon nitride layer portion 34A by a conventional ion-implantation process to form a P-type isolation region 36. N-type impurities (e.g., phosphorus (P)) are selectively introduced into the epitaxial layer 32 through the silicon nitride layer portion 34B by an ion-implantation process to form an N-type collector contact reigon 37 (FIG. 8). The above-mentioned production steps are the same as those of the prior art mentioned in relation to FIGS. 1 and 2.

Figure 9:
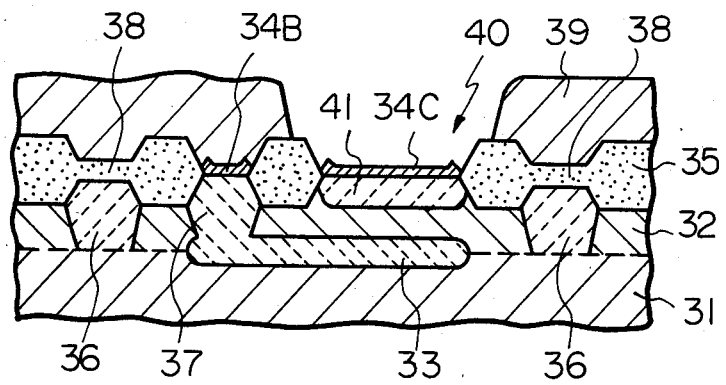

The silicon nitride layer portion 34A is removed by a photoetching process. An annealing treatment is carried out under an oxidizing atmosphere so that the silicon of the isolation region 36 is thermally oxidized to form an insulating layer 38 of silicon dioxide and, simultaneously, the doped regions 36 and 37 expand to reach the silicon substrate 31 and the buried layer 33, respectively, as illustrated in FIG. 9. A photoresist layer 39 is coated, exposed, and developed to form an opening 40 (FIG. 9) above a base-providing region. P-type impurities (e.g., boron) are introduced into the epitaxial layer 32 through the opening 40 and through the silicon nitride layer portion 34C by an ion-implantation process to form a base region 41.

Figure 10:
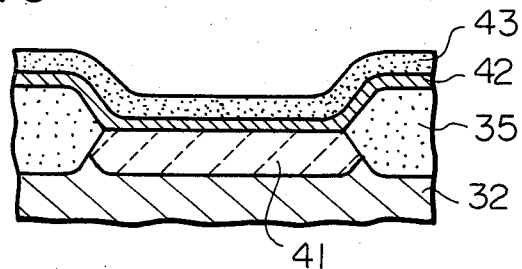

The silicon nitride portions 34B and 34C are removed with a suitable etchant. In accordance with the production method of the present invention, a high-melting-point metal layer 42 for a base electrode is formed on the exposed surfaces of the oxide layer 35 (and 38) and the base region 41 (and the collector contact region 37) by a sputtering process or a vacuum evaporation process, as illustrated in FIG. 10. In the case of the present invention, the high-melting-point metal is a metal having a melting point higher than the temperature of the heat treatments (e.g., annealing) in the production process. Gold (Au), molybdenum (Mo), or tungsten (W) can be used as the high-melting-point metal. In a case where gold is used for the metal layer, an alloy layer of titanium-palladium (Ti-Pd) or titanium-platinum (Ti-Pt) should be formed between the epitaxial layer and the gold layer so as to prevent a reaction between the gold layer and the silicon of the epitaxial layer. The high-melting-point metal layer 42 comprises the alloy layer and the gold layer. For example, the titanium-platinum layer having a thickness of approximately 50 nm is formed on the exposed surfaces by a sputtering process and the gold layer having a thickness of approximately 400 nm is formed on the titanium-platinum layer by a vacuum evaporation process. Then a first insulating layer 43 having a thickness of, e.g., approximately 1 $\mu$m is formed by depositing phosphosilicate glass (PSG), silicon nitride, or aluminum oxide on the high-melting-point metal layer 42 by a conventional CVD process, as illustrated in FIG. 10.

Figure 11:
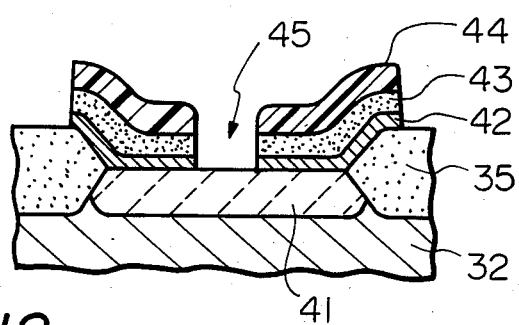
Figure 12:
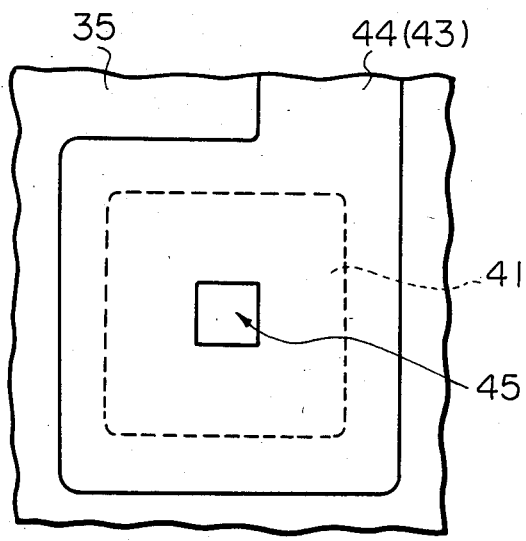
FIG. 12 is a plan view of a bipolar transistor in the stage of production shown in FIG. 11.

A photoresist layer 44, having a base electrode pattern, is formed on the first insulating layer 43, as illustrated in FIG. 11. The first insulating layer 43 is selectively etched by a suitable etching process, e.g., a sputter etching process, using trifluoromethane (CHF$_3$) gas. Then the high-melting-point metal layer 42 is selectively etched using the photoresist layer 44 and/or the first insulating layer 43 as a mask to form a base electrode having an opening 45 (FIG. 11). FIG. 12 is a plan view of a bipolar transistor in the intermediate stage of production shown in FIG. 11. In a case where the metal layer 42 is made of molybdenum or tungsten, this layer can be etched by a sputter etching process. In a case where the metal layer 42 comprises a gold layer and an alloy layer of titanium-palladium or titanium-platinum, the gold layer is etched by an ion-beam etching process using argon ion-beam bombarding at right angles to the substrate. The alloy layer is etched by a wet etching process using a suitable etching solution. In the ion-beam etching process, the etching rate of gold is 3 times greater than that of other materials, because of the conditions of the ion-beam etching process: the degree of vacuum of the argon (Ar) ion is as high as $2 \times 10^{-4}$ Torr, the acceleration voltage is from 0.5 to 1.0 kV, and the ion currently density is as high as 1 mA/cm$^2$. In this case, the alloy layer is used as a stopper.

Figure 13:
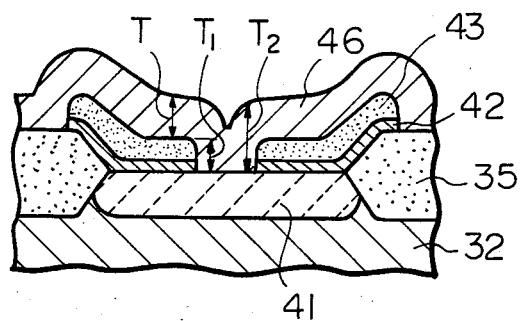
FIGS. 13 through 15 are schematic sectional views of a bipolar transistor in accordance with the present invention.

A second insulating layer 46 is formed by depositing phosphosilicate glass, silicon nitride or aluminum oxide on the exposed surface by a CVD process, as illustrated in FIG. 13. The thickness (T) of the second insulating layer 46 should be larger than the total thickness ($T_1$) of the first insulating layer 43 and the base electrode 42. As a result of the formation of the second insulating layer 46, the thickness ($T_2$) of a portion of (the second insulating layer 46 near the edges of the first insulating layer 43 is approximately two (2) times thicker than the thickness (T) of a portion of the second insulating layer 46 on the flat surface and the inclined surface.

Figure 14:
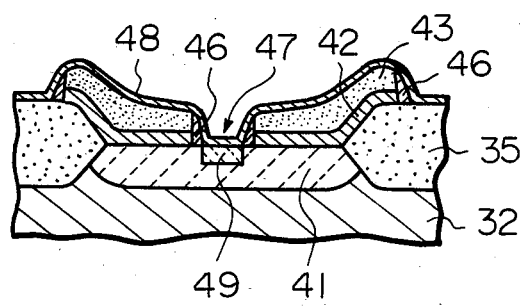

The second insulating layer 46 is anisotropically etched by a reactive sputter etching process using, e.g., $CHF_3$ gas, or a reactive ion-beam etching process using carbon tetrafluoride ($CF_4$) gas to form an opening 47 for defining an emitter-providing region, as illustrated in FIG. 14. In this case, since the thickness of the portion of the second insulating layer 46 near the sides of the first insulating layer 43 and the base electrode 42 is thicker than the remaining portion, small portions of the layer 46 remain on the sides of the base electrode 42 and the first insulating layer 43. Therefore, small portions of the layer 46 remaining within the opening 45 form the opening 47 in which a portion of the base region 41 is exposed. It is preferable to form a polycrystalline silicon layer 48 (having a thickness of, e.g., 100 nm) on the exposed surface by a CVD process so as to prevent a reaction between the emitter region and the electrode metal (e.g., Al). Then a photoresist layer (not shown) serving as a mask during an ion-implantation process is formed on the polycrystalline silicon layer 48. N-type impurities (e.g., arsenic (As)) are introduced (i.e., doped) into the base region 41 through the polycrystalline silicon layer 48 by an ion-implantation process using the photoresist layer and the first and second insulating layers 43 and 46 as a mask so that an emitter region 49 (FIG. 14) is formed. At the same time, an $N^+$-type region 50 (FIG. 15) is preferably formed in the collector contact region 37. In order to activate the base region 41, the emitter region 49, and the $N^+$-type region 50, annealing is carried out, for example, at 900° C. for approximately 30 minutes under a dry nitrogen ($N_2$) atmosphere. The polycrystalline silicon layer 48 has good electric conductivity due to the introduction of N-type impurities into it.

Figure 15:
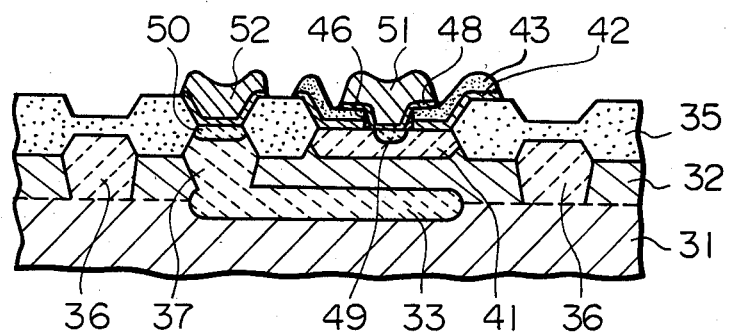

A metal layer is formed by depositing a metal having a good electric conductivity, such as aluminum, on the exposed surface by means of a vacuum evaporation process and is selectively etched to form an emitter electrode 51 and a collector electrode 52 by means of a photoetching process, as illustrated in FIG. 15. Then the polycrystalline silicon layer 48 is also selectively etched with a suitable etchant. Thus, a bipolar transistor is produced.

According to the present invention, the opening for defining the emitter-providing region can be formed in approximately the middle of the base region. If the opening is shifted somewhat toward or away from the middle, the undesirable short-circuiting between the collector and emitter does not occur since the thick field oxide layer covered with the metal layer and the first insulating layer is not etched. The base electrode and the emitter electrode are formed, respectively, and are arranged in a similar multilayer structure, whereby it is possible to reduce the base region area. Therefore, the density of a bipolar IC can be increased as compared with a conventional bipolar IC. Furthermore, it is possible to reduce the external base resistance and the parasitic capacitance between the collector and base so that the frequency characteristic ($f_T$) is improved.

It will be obvious that the present invention is not restricted to the above-mentioned embodiments, and that many variations are possible by persons with ordinary skill in the art. For example, a PNP-type bipolar transistor can be produced instead of the NPN-type bipolar transistor set forth above. Another isolation system (e.g., dielectric isolation) may be used instead of the P-N junction isolation system set forth above. It is possible to use silicide (e.g., $MoSi_2$, $WSi_2$, $TiSi_2$, and the like) as a material for the high-melting-point metal layer instead of the above-mentioned metals.

I claim:

1. A method for producing a bipolar transistor having a base region of a first conductivity type comprising the steps of:
   (a) depositing a high-melting-point metal selected from the group consisting of gold, molybdenum, and tungsten;
   (b) forming a first insulating layer on the base electrode, the first insulating layer and the base electrode forming a laminated layer;
   (c) selectively etching the laminated layer to form an opening having sides, in which a portion of the base region is exposed;
   (d) forming a second insulating layer, having a thickness greater than that of the laminated layer, formed on the laminated layer and the exposed portion of the base region;
   (e) anisotropically etching the second insulating layer, leaving portions of the second insulating layer along the sides of the opening of the laminated layer; and
   (f) introducing impurities of a second conductivity type opposite to the first conductivity type, into the base region by using the portions of the second insulating layer as a mask, to form an emitter region.

2. A method for producing a bipolar transistor as set forth in claim 1, wherein said step (d) comprises forming the second insulator from a material selected from the group consisting of phosphosilicate glass, silicon nitride, and aluminum oxide.

3. A method for producing a bipolar transistor according to claim 1, wherein said step (a) further comprises forming the high-melting-point metal base electrode from a gold layer and a thin alloy layer, formed under the gold layer, the alloy selected from the group consisting of titanium-platinum and titanium-palladium.

4. A method according to claim 1, wherein said anisotropical etching is a reactive sputter etching.

5. A method according to claim 1, wherein said anisotropical etching is reactive ion-beam etching.

* * * * *

UNITED STATES PATENT AND TRADEMARK OFFICE
CERTIFICATE OF CORRECTION

PATENT NO. : 4,590,666
DATED : MAY 27, 1986
INVENTOR(S) : HIROSHI GOTO

It is certified that error appears in the above-identified patent and that said Letters Patent is hereby corrected as shown below:

Col. 2, line 23, "collec" should be --collector--.

Col. 3, line 23, ", wherein:" should be --.--.

Col. 4, line 65, "currently" should be --current--.

Signed and Sealed this

Twenty-sixth Day of August 1986

[SEAL]

Attest:

DONALD J. QUIGG

Attesting Officer

Commissioner of Patents and Trademarks